(12) United States Patent
Dissanayake et al.

(10) Patent No.: US 10,333,017 B2
(45) Date of Patent: Jun. 25, 2019

(54) HOLE BLOCKING, ELECTRON TRANSPORTING AND WINDOW LAYER FOR OPTIMIZED CUIN$_{(1-x)}$GA$_{(x)}$SE$_2$ SOLAR CELLS

(71) Applicants: Brookhaven Science Associates, LLC, Upton, NY (US); The Research Foundation for The State University of New York, Stony Brook, NY (US)

(72) Inventors: Nanditha M. Dissanayake, Glen Cove, NY (US); Matthew Eisaman, Port Jefferson, NY (US); Ahsan Ashraf, Port Jefferson, NY (US); Nancy Goroff, Upton, NY (US); Xiuzhu Ang, Upton, NY (US)

(73) Assignees: Brookhaven Science Associates, LLC, Upton, NY (US); The Research Foundation for the State University of New York, Stony Brook, NY (US)

( * ) Notice: Subject to any disclaimer, the term of this patent is extended or adjusted under 35 U.S.C. 154(b) by 0 days.

(21) Appl. No.: 15/127,996

(22) PCT Filed: Mar. 20, 2015

(86) PCT No.: PCT/US2015/021833
§ 371 (c)(1),
(2) Date: Sep. 21, 2016

(87) PCT Pub. No.: WO2015/143371
PCT Pub. Date: Sep. 24, 2015

(65) Prior Publication Data
US 2017/0110616 A1    Apr. 20, 2017

Related U.S. Application Data

(60) Provisional application No. 61/968,873, filed on Mar. 21, 2014.

(51) Int. Cl.
*H01L 31/18* (2006.01)
*H01L 51/00* (2006.01)
(Continued)

(52) U.S. Cl.
CPC ........ *H01L 31/0749* (2013.01); *H01L 31/028* (2013.01); *H01L 31/02167* (2013.01);
(Continued)

(58) Field of Classification Search
CPC ......... H01L 31/03928; H01L 31/03923; H01L 31/0749; H01L 51/0045; H01L 51/0046;
(Continued)

(56) References Cited

U.S. PATENT DOCUMENTS

2009/0020157 A1*  1/2009  Krasnov ......... H01L 31/022425
                                                        136/256
2010/0187510 A1*  7/2010  Rostovtsev ......... H01L 51/0052
                                                        257/40
(Continued)

FOREIGN PATENT DOCUMENTS

CN      102522437 A      6/2012
WO      2013/022405 A1   2/2013

*Primary Examiner* — Lindsey A Bernier
(74) *Attorney, Agent, or Firm* — Fox Rothschild LLP

(57) ABSTRACT

Thin-film photovoltaic devices and methods of their use and manufacture are disclosed. More particularly, polycrystalline CuIn$_{(1-x)}$Ga$_x$Se$_2$ (CIGS) based thin-film photovoltaic devices having independently tunable sublayers are disclosed. Also provided are methods of producing an n-doped graphene.

9 Claims, 11 Drawing Sheets

Fig. 2

(51) Int. Cl.
*H01L 51/42* (2006.01)
*H01L 31/028* (2006.01)
*H01L 31/0216* (2014.01)
*H01L 31/0224* (2006.01)
*H01L 31/0392* (2006.01)
*H01L 31/0749* (2012.01)

(52) U.S. Cl.
CPC ...... *H01L 31/022441* (2013.01); *H01L 31/18* (2013.01); *H01L 51/0045* (2013.01); *H01L 51/0046* (2013.01); *H01L 51/4213* (2013.01); H01L 31/03923 (2013.01); H01L 31/03928 (2013.01); H01L 51/0072 (2013.01); Y02E 10/541 (2013.01); Y02E 10/547 (2013.01); Y02E 10/549 (2013.01); Y02P 70/521 (2015.11)

(58) Field of Classification Search
CPC . H01L 51/0072; H01L 51/4213; Y02E 10/50; Y02E 10/541; Y02E 10/549
See application file for complete search history.

(56) References Cited

U.S. PATENT DOCUMENTS

| | | |
|---|---|---|
| 2012/0098028 A1* | 4/2012 | Naito ............... H01L 51/0036 257/103 |
| 2012/0223291 A1 | 9/2012 | Klem et al. |
| 2012/0227811 A1* | 9/2012 | Lau ................... C04B 35/547 136/262 |
| 2012/0241723 A1* | 9/2012 | Klem ................. B82Y 10/00 257/21 |
| 2012/0292675 A1 | 11/2012 | Roizin et al. |
| 2013/0327377 A1 | 12/2013 | Ting et al. |
| 2014/0054550 A1 | 2/2014 | Hong et al. |

* cited by examiner

HOLE BLOCKING, ELECTRON TRANSPORTING AND WINDOW LAYER FOR OPTIMIZED $CUIN_{(1-x)}GA_{(x)}SE_2$ SOLAR CELLS

CROSS-REFERENCE TO RELATED APPLICATIONS

This application claims priority under 35 USC § 119(e) to U.S. Provisional Patent Application Ser. No. 61/968,873, filed on Mar. 21, 2014, which is hereby incorporated by reference in its entirety.

The present invention was made with government support under contract number DE-AC02-98CH10886 and DE-SC0012704 awarded by the United States Department of Energy. The United States government has certain rights in this invention.

FIELD OF THE INVENTION

The invention relates to thin-film photovoltaic devices and methods of their use and manufacture. More particularly, the invention relates to polycrystalline $CuIn_{(1-x)}Ga_{(x)}Se_2$ (CIGS) based thin-film photovoltaic devices having independently tunable sublayers. In one embodiment, the invention relates to a CIGS photovoltaic device having a quasi-2D material as the n-doped extraction layer. In another embodiment, the invention relates to a CIGS photovoltaic device having a novel organic based hole blocking layer(s). In yet another embodiment, the invention relates to a CIGS photovoltaic device having a novel n-type fullerene layer(s).

BACKGROUND

Polycrystalline copper indium gallium selenide ($CuIn_{(1-x)}Ga_{(x)}Se_2$ or CIGS) based direct bandgap semiconductors are strong candidates for low cost, high-throughput solar energy harvesting thin film photovoltaic devices. State of the art CIGS devices (X=0.3), as shown in FIG. 1A, demonstrate 15-18% power conversion efficiencies with best cell performance reaching 20.4%. (Repins, M. A. et al. *Prog. Photovoltaics Res. Appl.* 16 (2008) 235, "EMPA announces 20.4% efficient thin film CIGS-on-polymer cell." PV Magazine.com, January 2013; incorporated by reference in its entirety). However, this is well below the (32.8%) Shockley-Queisser theoretical maximum predicted for the identical (X=0.3) material composition with 1.15 eV bandgap (S. Siebentritt, *Solar Energy Materials & Solar Cells* 95, 1471-1476 (2011)). The main reasons for this disparity are due to the effects of parasitic layer absorption and charge recombination at the interface and the bulk of the CIGS layer.

With regard to the parasitic layer absorption, apart from the light absorbing active layer of $CuIn_{(1-x)}Ga_{(x)}Se_2$ in CIGS cells, there are several other non-active layers for charge-collection, electric-field formation and passivation. As shown in FIG. 1B, conventional electron extraction and window/passivation layers in CIGS PVs are fabricated using doped degenerated-oxide layers, such as aluminum-doped ZnO (AZO), Indium Tin Oxide (ITO) (~160 nm) and intrinsic-ZnO (iZnO) (~80 nm). Chemical bath deposited (CBD) CdS (~50 nm) is universally used as the conventional n-doped layer in CIGS, which form the built-in field for charge extraction with the p-doped CIGS layer. Even though these layers have high optical transmission within the longer wavelengths (up to 1100 nm), there is a significant drop in transmission in the shorter wavelengths (below 500 nm for AZO, below 400 nm for iZnO and below 700 nm for CdS, respectively). These incremental reductions in transmission cumulatively reduce the amount of light transmitted to the CIGS active layer. As a result, a significant drop in the external quantum efficiency is seen in the state-of-art CIGS cells in the lower wavelengths, limiting the overall photo-current produced by these devices. Overall the cumulative optical loss in the parasitic layers leads to nearly 5% absolute loss in the power conversion efficiency.

With regard to the charge recombination effects, the composition within the CIGS active layer is highly inhomogeneous in the directions perpendicular to the substrate, as well as in the in-plane direction. Some degree of inhomogeneity, for example the graded composition of Ga ratio and Cu-poor top-layer in CIGS, is considered beneficial for the performance (i.e. improving charge collection efficiency, reducing defects) of the CIGS. However, exact replication of these favorable conditions is not always possible and the resulting inhomogeneity leads to an unfavorable disorder in the CIGS active layer, especially in large area CIGS solar cells. Such disorder leads to the formation of defects enhancing CdS/CIGS interfacial and bulk charge recombination within the space-charge region of the device. These charge recombination effects significantly lower the open circuit voltage ($V_{oc}$), Fill Factor and the short circuit current density ($J_{sc}$) in CIGS cells and also create non-uniformities in performance of CIGS based modules, which increases their cost.

A solution to overcome the above-described inadequacies and shortcomings in the present CIGS solar cells is desired. In particular, it would be desirable to produce a CIGS solar cell device with reduced parasitic layer absorption and reduced charge recombination effects.

SUMMARY

Having recognized the shortcomings of the prior art, in one aspect, a photovoltaic device is presently provided having a structure that may reduce parasitic layer absorption, charge recombination effects, or both. In some embodiments, the present structure of the CIGS solar cell affords significantly higher charge transport capability, improved performance, and lower fabrication and maintenance cost. This ultimately results in a lower levelized cost of electricity. In other embodiments, the present structure of the CIGS solar cell can also reduce the interfacial recombination and passivate interfacial traps on the CIGS, to enhance the open circuit voltage and fill factor. In yet other embodiments, the present structure of the CIGS solar cell has a higher theoretical conversion efficiency than the current state of the art.

In some embodiments, the photovoltaic device of the present invention includes a substrate, a back contact layer, an absorber layer comprising p-doped polycrystalline $CuIn_{1-x}Ga_xSe_2$, where x is between 0.3 and 1, and an n-doped charge-separation/collection layer, said charge-separation/collection layer comprising a fullerene or a quasi two-dimensional material. In some embodiments, the charge-separation/collection layer comprises a fullerene. In some embodiments, the quasi two-dimensional (2D) material comprises graphene, $MoS_4$ or a combination thereof. In some embodiments, the quasi two-dimensional (2D) material is an n-doped separation/collection layer, having a crystalline structure selected from graphene and/or molybdenum disulfide ($MoS_2$). These quasi 2D crystalline materials have high optical transparency, significantly higher charge transporting capability and can be readily doped using facile chemical approaches. As a result, such materials demonstrate improved performance compared to systems currently used in CIGS photovoltaics.

In some embodiments, the conventional electron extraction layer, based on n-doped chemical bath deposited (CBD) CdS, may be replaced with an n-type fullerene, such as a $C_{60}$ spherical fullerene. It is believed that the use of the fullerene based electron extractors, alone or in combination with the disclosed hole-blocking layer and/or the window/passivation layer(s), allow the utilization of devices having a ratio of Ga to (Ga+In) of about 0.5 ($CuIn_{(1-x)}Ga_{(x)}Se_2$ where x~0.5), which have higher theoretical efficiency (~33%) and promising CIGS photovoltaics with higher conversion efficiencies than the currently available devices. Specifically, the $CuIn_{0.5}Ga_{0.5}Se_2$ compound has a bandgap of 1.35 eV, which gives the theoretically maximum conversion efficiency at AM1.5G for a single junction photovoltaic.

In some embodiments, the substrate is selected from a glass, a polymer foil, or a metal foil. Soda lime glass is commonly used as a substrate, because it contains Sodium (Na), which has been shown to yield a substantial increase in open-circuit voltage, notably through surface and grain boundary defect passivation. However, other lighter and more flexible substrates can also be used, such as polyimide or metal foils.

In some embodiments, the photovoltaic device may further includes an organic based hole blocking layer positioned between the absorber layer and the charge-separation/collection layer. In some embodiments, the organic based hole blocking layer comprises a phenanthroline compound or a derivative thereof selected from Formula 1, Formula 2 or a combination thereof:

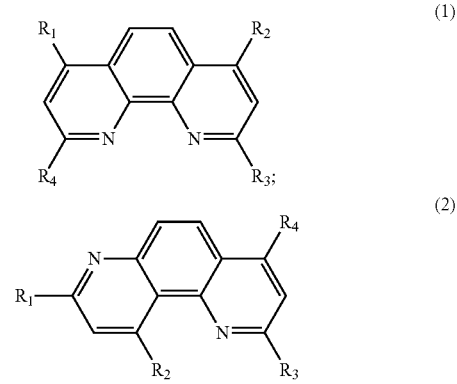

(1)

(2)

wherein $R_1$-$R_4$ are independently selected from H, Alkyl, or Phenyl. It is believed that the conversion efficiency of the disclosed CIGS devices can be enhanced by up to 7% by using such organic hole blocking layers, boosting the CIGS performance closer to the theoretical maximum for the (X=0.3) CIGS devices.

In some embodiments, the organic based hole blocking layer comprises a phenanthroline compound or a derivative of Formula (2) selected from 2,8-diphenyl-1,7-phenanthroline, 2,8-dimethyl-1,7-phenenthroline, 2,4-dimethylbenzo[j][1,7] phenenthroline or a combination thereof.

In some embodiments, the photovoltaic device further includes a $TiO_2$ blocking layer between the absorber layer and the charge-separation/collection layer.

In another aspect, a photovoltaic device is provided comprising a substrate, a back contact layer, an absorber layer made from a p-doped polycrystalline $CuIn_{1-x}Ga_xSe_2$, where x is between 0.3 and 1; an n-type electron extraction layer; and an organic based hole blocking layer. In some embodiments, the substrate is selected from a glass, a polymer foil, or a metal foil.

In some embodiments, the organic based hole blocking layer comprises a phenanthroline compound or a derivative thereof selected from Formula 1, Formula 2 or a combination thereof:

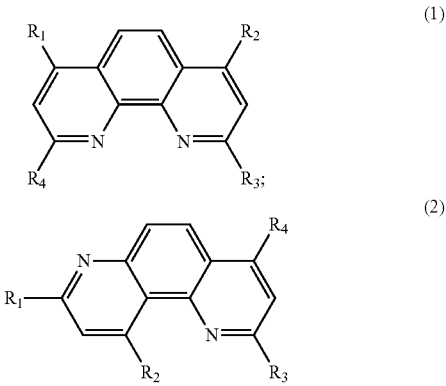

(1)

(2)

where $R_1$-$R_4$ are independently selected from H, Alkyl, or Phenyl

In some embodiments, the organic based hole blocking layer comprises a phenanthroline compound or a derivative of Formula (2) selected from 2,8-diphenyl-1,7-phenanthroline, 2,8-dimethyl-1,7-phenenthroline, 2,4-dimethylbenzo[j][1,7] phenenthroline or a combination thereof.

In some embodiments, the n-type electron extraction layer of the photovoltaic device comprises one or more compounds selected from CdS, $Cd_{(1-x)}Zn_xS$, (Cd,Zn)S, ZnS, $Zn_x(O,S)_y$, $Zn(O,S,OH)_x$, ZnO, $Zn(O,OH)_x$, $In_x(OH,S)_y$, $In_2S_3$, $In(OH)_3$, $SnO_2$, $Sn(S,O)_2$, ZnSe, $Zn(Se,OH)_x$, $ZrO_2$, MnS, or $Mn(S,OH)_x$.

In some embodiments, the n-type electron extraction layer includes an n-type fullerene layer.

In some embodiments, the photovoltaic device further includes a window/passivation layer, which contains a doped degenerated-oxide. In some embodiments, the doped degenerated-oxide is selected from aluminum-doped Zinc Oxide (AZO), Indium Tin Oxide (ITO) or intrinsic-Zinc Oxide (i-ZnO).

In another aspect, a method of manufacturing a photovoltaic cell is provided, comprising depositing a back contact layer on a surface of a substrate; depositing a p-type polycrystalline $CuIn_{1-x}Ga_xSe_2$ (CIGS) absorber layer, where x is between 0.3 and 1 on a surface of the back contact layer; depositing an insulating layer or a passivation layer on a surface of the absorber layer opposite to the back contact layer; and transferring a graphene monolayer onto a surface of the insulating layer or a surface of the passivation layer without damaging the absorber layer. In some embodiments, the insulating layer comprises an oxide which can be $Al_2O_3$, $SiO_2$ or a combination thereof. In some embodiments, the passivation layer comprises a nitride.

In some embodiments, a molybdenum (Mo) layer is deposited (commonly by sputtering), which serves as the back contact and to reflect most of the unabsorbed light back into the absorber. Following Mo deposition a p-type polycrystalline $CuIn_{(1-x)}Ga_{(x)}Se_2$ (CIGS) absorber layer is grown by one of several methods known in the art. A thin n-type electron extraction layer is added on top of the absorber. The electron extraction layer is typically Cadmium Sulfide (CdS)

deposited via chemical bath deposition. The electron extraction layer is overlaid with a doped degenerated-oxide layer or layers, such as aluminum-doped Zinc Oxide (AZO), Indium Tin Oxide (ITO) and/or intrinsic-Zinc Oxide (i-ZnO). In one exemplary embodiment, the electron extraction layer is overlaid with a thin, intrinsic ZnO layer (i-ZnO), which is capped by a thicker, Al doped ZnO layer (AZO). The i-ZnO layer is used to protect the CdS and the absorber layer from sputtering damage while depositing the ZnO:Al window layer, since ZnO:Al is usually deposited by DC sputtering. The AZO serves as a transparent conducting oxide to collect and move electrons out of the cell.

In another aspect, a method of converting light to electric current is provided comprising exposing the photovoltaic device of the present invention to light.

In another aspect, a method of producing an n-doped graphene is provided comprising contacting a first surface of a p-doped semiconductor material with an alkaline metal-containing substrate, wherein said alkaline metal-containing substrate is optionally coated with a back contact layer; and contacting a second surface of said p-doped semiconductor material with a graphene, wherein said graphene is not n-doped prior to the contact, and wherein said second surface of said p-doped semiconductor material is optionally coated with an insulating layer or a passivation layer.

In some embodiments, the alkaline metal is sodium.

In some embodiments, the substrate comprises soda lime glass.

In some embodiments, the p-doped semiconductor material comprises $CuIn_{1-x}Ga_xSe_2$, where x is between 0.3 and 1.

In another aspect, a method of producing an n-doped graphene is provided comprising contacting an alkaline metal-containing substrate with a graphene, wherein said graphene is not n-doped prior to the contact, and wherein said alkaline metal-containing substrate contains an alkaline in an amount effective to produce n-doped graphene.

In some embodiments, the alkaline metal is sodium.

In some embodiments, the substrate comprises soda lime glass.

In another aspect, an article of manufacture is provided comprising the n-doped graphene produced according to the present invention.

The present objectives, features and advantages of the disclosed invention will be apparent from the following detailed description of the invention, which is to be read in conjunction with the accompanying drawings. The scope of the invention will be pointed out in the claims. The following drawings, taken in conjunction with the subsequent description, are presented to enable one of ordinary skill in the art to make and use the invention and to incorporate it in the context of particular applications.

BRIEF DESCRIPTION OF THE DRAWINGS

FIG. 8($b$) shows the I-V device characteristics in the dark in the Graphene/CIGS device.

FIG. 8($c$) shows the I-V device characteristics between the top-Au and bottom-Mo contact of a 100 $\mu m^2$ device area graphene/CIGS PV device.

FIG. 9($b$) shows the comparison of the transconductance measured on the following substrates: CIGS/Mo/SLG (red curve), CIGS/Mo/BSG (yellow), SLG (green), Si/SiO2 (blue)

DETAILED DESCRIPTION

Figure 1A:
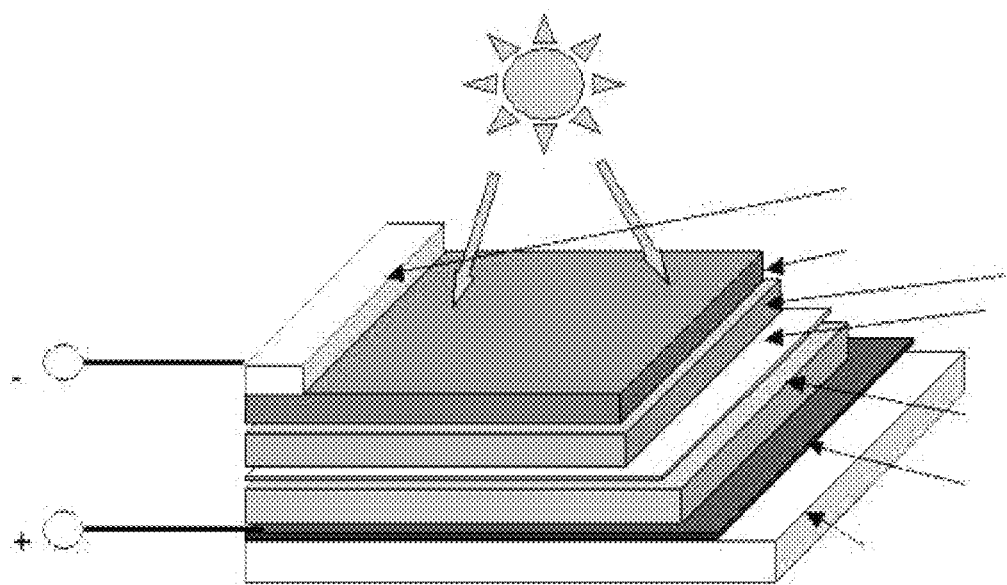
FIG. 1A illustrates prior art CIGS based solar cell design.
Figure 1B:
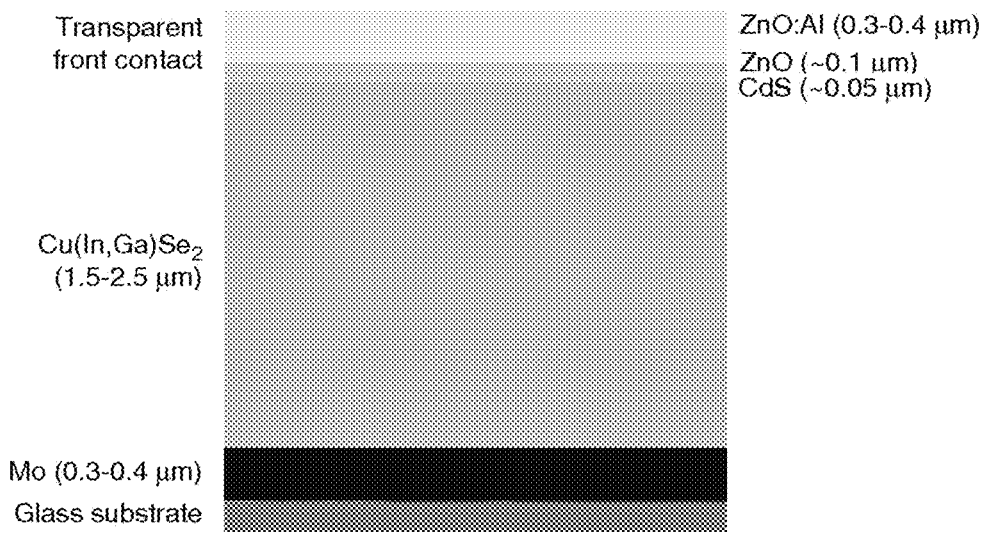
FIG. 1B illustrates conventional electron extraction and window/passivation layers in CIGS PVs fabricated with doped degenerated-oxide layers.

Various embodiments of the present $CuIn_xGa_{1-x}Se_2$ (CIGS) solar cells (also known as photovoltaic cells) have a structure that affords reduced parasitic layer absorption, reduced charge recombination effects or both. The present structure of the CIGS solar cell affords higher charge transporting capability, improved performance, and lower fabrication and maintenance cost. This structure thus ultimately results in lower levelized costs of electricity that may be produced by the disclosed CIGS solar cells. The present structure of the CIGS solar cell can also reduce the interfacial recombination and passivate interfacial traps on the CIGS to enhance the open circuit voltage and fill factor. In some embodiments, the present structure of the CIGS solar cell can have higher theoretical conversion efficiency than the current, state of the art, CIGS solar cells.

While the following text may reference or exemplify specific steps of ceramics sintering, it is not intended to limit the scope of the invention to such particular reference or examples. Various modifications may be made by those skilled in the art, in view of practical and economic considerations, such as the width of the n-doped graphene and the structural variations of the compounds for the organic blocking layer. In order to more clearly and concisely describe the subject matter of the claims, the following definitions are intended to provide guidance as to the meaning of terms used herein.

The articles "a" and "an" as used herein mean "one or more" or "at least one," unless otherwise indicated. That is, reference to any element or component of the present invention by the indefinite article "a" or "an" does not exclude the possibility that more than one of the element or component is present.

The term "about" as used herein means the referenced numeric indication plus or minus 10% of that referenced numeric indication.

The present photovoltaic device such as CIGS-based solar cells generally has a substrate, a back contact layer, an absorber layer, an electron extraction layer and one or more window/passivation layers. Soda lime glass is commonly used as the substrate, because it contains Sodium (Na) and has been shown to yield a substantial open-circuit voltage increase, notably through passivation of surface and grain boundary defects. However, other lighter and more flexible substrates can also be used in the disclosed embodiments, including flexible polymer foils, such as polyimide, and/or metal foils. A molybdenum (Mo) layer is deposited, for example by sputtering on the surface of the glass substrate. The Mo layer may serve as the back contact and as a back contact layer that reflects most unabsorbed light back into the absorber. The width of the back contact layer is between 100 nm and 1000 nm, preferably between 100 nm and 500 nm or more preferably between 300 nm and 400 nm. In one disclosed embodiment, the back contact layer is made from Mo having a width of about 330 nm.

The disclosed CIGS device is manufactured by deposition of a p-type polycrystalline $CuIn_{1-x}Ga_xSe_2$ (CIGS) absorber layer, where x is between 0.1 and 1, and may be 0.3 specifically, on the back contact layer, which is grown by one of several methods known in the art. One of these methods is a vacuum-based process, where copper, gallium, and indium are co-evaporated or co-sputtered onto a substrate at room temperature. The resulting film is then annealed with a selenide vapor to form the final CIGS structure. In an alternative process copper, gallium, indium and selenium are co-evaporated onto a heated substrate. In a non-vacuum-based alternative process, nanoparticles of the precursor materials are deposited on the substrate and then sintered in situ. Electroplating is another low cost alternative to apply the CIGS layer. The width of the CIGS layer is between 1 μm and 3 μm, 1.5 μm and 2.5 μm or about 2.3 μm.

Once the absorber layer is grown, a thin n-type electron extraction layer is added on top of the absorber. The electron extraction layer may be Cadmium Sulfide (CdS) (2.4 eV bandgap), deposited via chemical bath deposition (CBD). However, in some embodiments, the electron extraction layer may be partially or completely Cd free, such as $Cd_{(1-x)}Zn_xS$, (Cd,Zn)S, ZnS, $Zn_x(O,S)_y$, $Zn(O,S,OH)_x$, ZnO, $Zn(O,OH)_x$, $In_x(OH,S)_y$, $In_2S_3$, $In(OH)_3$, $SnO_2$, $Sn(S,O)_2$, ZnSe, $Zn(Se,OH)_x$, $ZrO_2$, MnS, or $Mn(S,OH)_x$, typically having a higher bandgap than CdS (~3.6 eV for ZnS). Cd-partial electrolyte treatment can also be used as an alternative to a CdS layer in CIGS. When using CBD deposited n-doped CdS layer, which forms the built-in electric field with CIGS there may be an absorption in the low wavelength region due to the low bandgap (2.4 eV). Alternatives, such as $Cd_{(1-x)}Zn_xS$, ZnS, which have higher bandgap (+3.6 eV), may improve optical transmission properties compared to CdS. However, these may still contain Cd (e.g., $Cd_{(1-x)}Zn_xS$) and they may suffer from detrimental effects of Cd, such as low open current voltage ($V_{oc}$). To overcome such drawbacks, in some embodiments, the present electron extraction layer is an electron transporting (n-type) fullerene, alone or in combination/conjugation with a polymer. In one embodiment, the fullerene is buckminster fullerene $C_{60}$ or a derivative of the buckminster fullerene. It is believed that the use of fullerene as an electron extractor alone, or in combination with other aspects of the disclosed embodiments may allow the utilization of devices having x=0.5 in the $CuIn_xGa_{1-x}Se_2$ (CIGS) absorber layer (i.e. Ga/(Ga+In). Without being bound by theory, such devices have a higher theoretical efficiency (~32.8%), resulting in CIGS photovoltaics with higher conversion efficiencies than the currently available devices.

The electron extraction layer can be overlaid with one or more window/passivation layers, for example a doped degenerated-oxide, such as aluminum-doped Zinc Oxide (AZO), Indium Tin Oxide (ITO) and/or intrinsic-Zinc Oxide (i-ZnO). In one exemplary embodiment, the electron extraction layer is overlaid with a thin, intrinsic ZnO layer (i-ZnO), which is capped by a thicker, Al doped ZnO layer (AZO). The i-ZnO layer is used to protect the CdS and the absorber layer from sputtering damage while depositing the ZnO:Al window layer, since the latter is usually deposited by DC sputtering. The AZO serves as a transparent conducting oxide to collect and move electrons out of the cell.

A drawback of using AZO, i-ZnO and ITO as window/passivation layers can be their poor, low-wavelength optical transmission. Furthermore, due to the low resistivity of these materials, thick layers of oxides may be necessary to reduce the series resistance of the devices, which increases the overall cost of the CIGS cells. The conventional CBD deposited n-doped CdS layer, which forms the built-in electric field with CIGS, also has significant absorption in the low wavelength region due to the low bandgap (2.4 eV) of the Cds layer. To overcome such drawbacks of the prior art, in some embodiments, the conventional window/passivation layers that are based on doped degenerated-oxide layers and the conventional electron extraction layer that is based on n-doped CdS are replaced with a quasi-2-dimensional (2D) material. Further, the quasi 2-dimensional (2D) material may be an n-doped separation/collection layer having a crystalline structure selected from graphene, molybdenum disulfide ($MoS_2$), or a combination of both. "Quasi 2-dimensional" is a well-understood term of art as used in various literatures (e.g. Ou, et al. Nano Lett. 2014, 14 (2), 857-863; Kvashnin, et al. Nano Lett. 2014, 14 (2), 678-681).

In one exemplary embodiment, the graphene is synthesized by chemical vapor deposition and thereafter transferred to the CIGS active layers. The graphene sheet is a monolayer that is n-doped to form a built-in electric field when interfaced with p-doped CIGS. Modulating the doping density (~$5 \times 10^{13}$ $cm^{-1}$ for graphene) can control the built-in field (and $W_d$) to achieve a desired collection efficiency, by adjusting its drift-diffusion length ratio independent of the CIGS device. In turn, the adjusted collection efficiency may allow increasing the GGI ratio towards 0.5 for the desired SQ-bandgap (1.35 eV), without being affected by the concomitant increase in hole-density that may result in shorter $W_d$ and/or a buried-homojunction. In one exemplary embodiment, the disclosed graphene/CIGS solar cell can achieve nearly 24% conversion efficiency, assuming no-defects, GGI ratio is 0.5, and a hole density of $5 \times 10^{17}$ $cm^{-3}$.

Figure 4A:
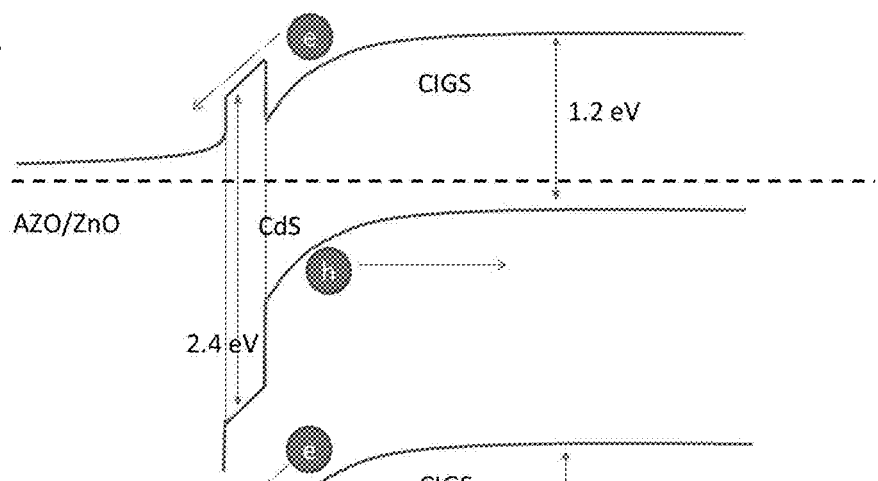
FIG. 4A is a plot illustrating the equilibrium energy band-diagram of a conventional AZO/iZnO/CdS/CIGS/Mo CIGS device of the prior art.
Figure 4B:
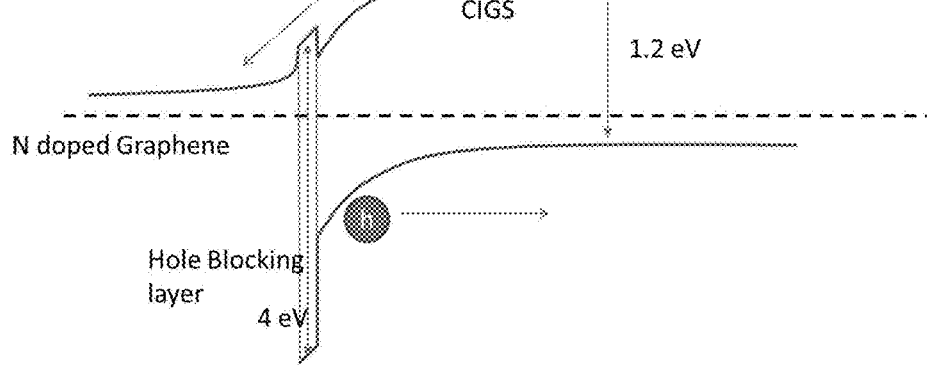
FIG. 4B is a plot illustrating the equilibrium energy band-diagram of the disclosed hybrid CIGS device, where the AZO/IZO/CdS is replaced by an N-doped graphene and hole-blocking layer.

Quasi 2-dimensional materials such as graphene and $MoS_2$ have unique optical and electrical properties. A single layer graphene, for example, has wavelength independent optical transparency of 97.5% and high electron and hole mobility, which may be suitable for fabricating transparent conductive layers for photovoltaics and light emitting diodes. Moreover, due to the reduced density of states, these materials may be easily doped from electron doped to hole doped condition. As illustrated in FIG. 4A, the equilibrium band diagram within a conventional AZO/IZO/CdS/CIGS/Mo device has a bandgap of 2.4 eV. In contrast, as shown in FIG. 4B, the Fermi level of the graphene is closer to iZnO (4.7 eV). A heterojunction is formed between the CIGS and N-doped graphene. The equilibrium band diagram within a doped graphene layer with a hole-blocking layer (e.g., BCP), inserted between the electron-extracting graphene layer and the CIGS has a bandgap of 4 eV. As a result, such materials demonstrate improved performance compared to conventional systems currently used in CIGS photovoltaics. The width of the N-doped graphene is between 0.5 nm and 10 nm, further 0.5 and 2 nm, and further still about 1 nm.

In conventional CIGS PVs, CdS acts both as the n-doped and the hole-blocking layer. In order to block holes while passing electrons, a band alignment with a conduction band offset ("spike") of <0.3 eV is needed. If the appropriate CdS/CIGS band offset is not satisfied, significant recombination and poor diode behavior is likely, which becomes more significant for CIGS with a SQ bandgap of about 1.35 eV. In some embodiments, the structure of the present CIGS solar cell further has an organic hole blocking layer, between the absorber layer and the window/passivation and electron extraction layers. The organic hole blocking layer mitigates recombination and passivates the top interface of CIGS, enabling a route for unconstrained optimization towards the SQ-limit. In particular, the disclosed hole-blocking layer maintains a constant band-offset (by shifting the electron affinity to match the CIGS layer), thereby minimizing interfacial recombination and diode behavior regardless of the CIGS bandgap.

The organic hole blocking layer comprises at least one aromatic ring structure. Non-limiting examples of aromatic structures include monocyclic, bicyclic, tricyclic, tetracyclic, and pentacyclic rings. Various aromatic structures can be conjugated to each other or inter-connected via a linker.

The organic based hole blocking layer may contain a phenanthroline compound or a derivative thereof of Formula (1) or Formula (2),

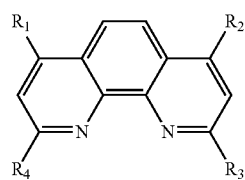

1,10-phenanthroline derivatives (1)

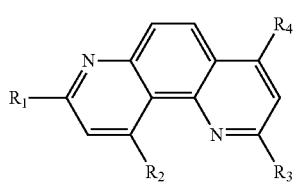

1,7-phenanthroline derivatives (2)

where $R_1$-$R_4$ are independently selected from H, Alkyl, or Phenyl. The alkyl can be chain-shaped or branched. Non-limiting examples of alkyl groups may contain 1-20 carbons, all subunits included. The alkyl or phenyl group may be further substituted with one or more substituents. Non-limiting examples of the substituents include halo, hydroxy, oxo (e.g., an annular —CH— substituted with oxo is —C(O)—), nitro, halohydrocarbyl, hydrocarbyl, aryl, aralkyl, alkoxy, aryloxy, amino, acylamino, alkylcarbamoyl, arylcarbamoyl, aminoalkyl, acyl, carboxy, hydroxyalkyl, alkanesulfonyl, arenesulfonyl, alkanesulfonamido, arenesulfonamido, aralkyl-sulfonamido, alkylcarbonyl, acyloxy, and cyano. The selection of the side groups $R_1$-$R_4$ can be varied to adjust the electronic and morphological properties, for example, by making it more electro-negative by shifting the lowest-unoccupied molecular orbital energy. Since the CIGS interface is independent of the bulk device, the most optimal CIGS devices can be pursued. In some embodiments, one or more of the side groups of phenanthroline may be dipolar and selected from thiol, amine or carboxylic-acid. The dipolar side-groups can provide additional passivation for the charged dislocations and grain-boundaries to minimize non-radiative recombination pathways.

In some embodiments, the organic based hole blocking layer contains a compound of Formula (2). Non-limiting examples of Formula (2) include the following compounds 1, 2 and 3:

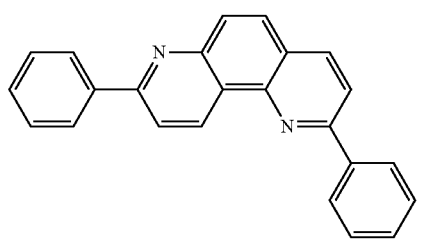

1

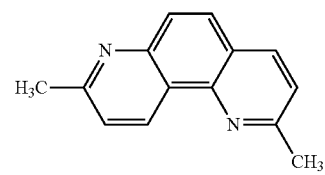

2

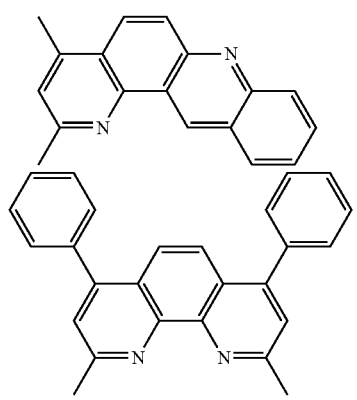

3

BCP

Compounds 1, 2 and 3 demonstrate suitable properties for the present invention. For example, the optical band gaps of phenanthrolines 1 and 2 in solution were determined by UV-Vis spectroscopy. For compound 1, the maximum absorptions were measured at approximately 310 nm and 254 nm. For compound 2, the maximum absorptions were measured at approximately 273 nm and 236 nm. These absorptions correspond to optical band gaps of 3.65 eV for compound 1 and 4.14 eV for compound 2, both somewhat higher than that of BCP (3.5 eV). Meanwhile, using solution-phase cyclic voltammetry, the energies of the highest occupied molecular orbital (HOMO) and lowest unoccupied molecular orbital (LUMO) levels of phenanthrolines 1 and 2 were identified. For compound 1, the measured energy levels are HOMO=−6.63 eV and LUMO=−2.70 eV. For compound 2, the measured energy levels are HOMO=−6.78 eV, and LUMO=−2.34 eV.

The synthesis of 1,7-phenanthroline compounds is well known in the art and has been reported in various literature including Su et al., Org. Lett. 2013, 16, 18-21 and Jacini et al., Monatsh Chem 1988, 119 (6-7), 761-780, the entire disclosure of which is hereby incorporated by reference.

Other compounds that can be used in the organic based hole blocking layer include for example, monooxadiazoles, dimeric oxdiazoles, branched oxadiazoles, trizoles, metal chelates, triazines, benzimiazoles (e.g., TPBI), quinolines, quinoxaline, or a combination thereof described in detail in Kulkarni et al., Chem. Mater. 2004, 16, 4556-4573, which is incorporated here by reference in its entirety. Examples of these compounds are provided in Table 1.

TABLE 1

| Formula | Chemical Family | Chemical |
|---------|-----------------|----------|
|         | Oxadiazole      | 2-(4-biphenyl)-5-(4-tert-butylphenyl)-1,3,4-oxadiazole(PBD) |
|         |                 | 2,4-bis(4-naphthyl)-1,3,4-oxadiazole(BND) |
|         | Dimeric oxadiazoles |      |
|         | Branched oxadiazoles |     |

TABLE 1-continued

| Formula | Chemical Family | Chemical |
|---|---|---|

6c

7

| | $R_1$ | $R_2$ | $R_3$ |
|---|---|---|---|
| 7a | H | C(CH$_3$)$_3$ | C(CH$_3$)$_3$ |
| 7b | OCH$_3$ | OCH$_3$ | H |
| 7c | H | CF$_3$ | H |

| | Metal Chelates | tris(8-hydroxyquinoline) aluminum (Alq3) |

116a-c, Mq$_3$
a M = Al
b M = Ga
c M = In

TABLE 1-continued
| Formula | Chemical Family | Chemical |
|---|---|---|
| 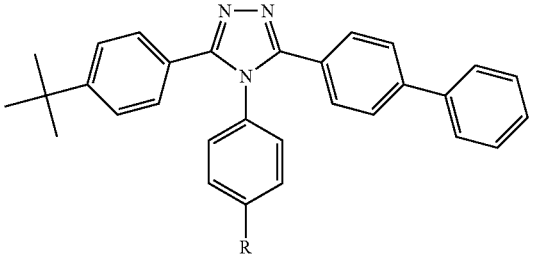  R = H, 19a  = C$_2$H$_5$, 19b | Trizole | 1,2,4-Triazole |
| 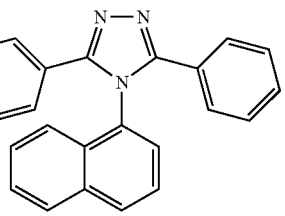  19c | | |
| 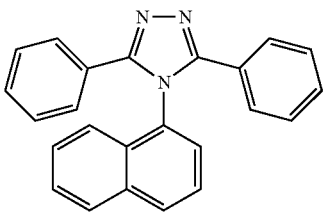  20 | Reviews Triazines | 1,3,5-Triazines |
| 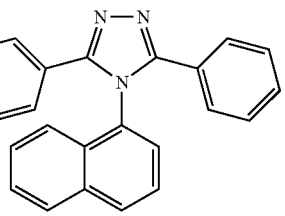  22 | TPBI | 1,3,5-tris(N-phenyl-benzimidizol-2-yl)benzene |

TABLE 1-continued

| Formula | Chemical Family | Chemical |
|---|---|---|
| 28 | Quinoline | |
| 31 | Quinoxaline | Bis(phenylquinoxaline) |
| 32 | | tris(phenylquinoxaline) |

The disclosed organic based hole blocking layer has a wide-bandgap (~3.5 eV) and reduces the interfacial recombination and passivates interfacial traps on the CIGS and thereby enhances the open circuit voltage ($V_{oc}$) and fill factor. It is believed that the conversion efficiency can be enhanced by up to 7% by using such organic hole blocking layer, boosting the CIGS performance closer to the theoretical maximum for the current best CIGS devices (X=0.3).

A blocking layer comprising $TiO_2$ may also be used between the absorber layer and the charge-separation/collection layer. The $TiO_2$ layer can be used alone or in combination with the organic block layer.

Figure 2:
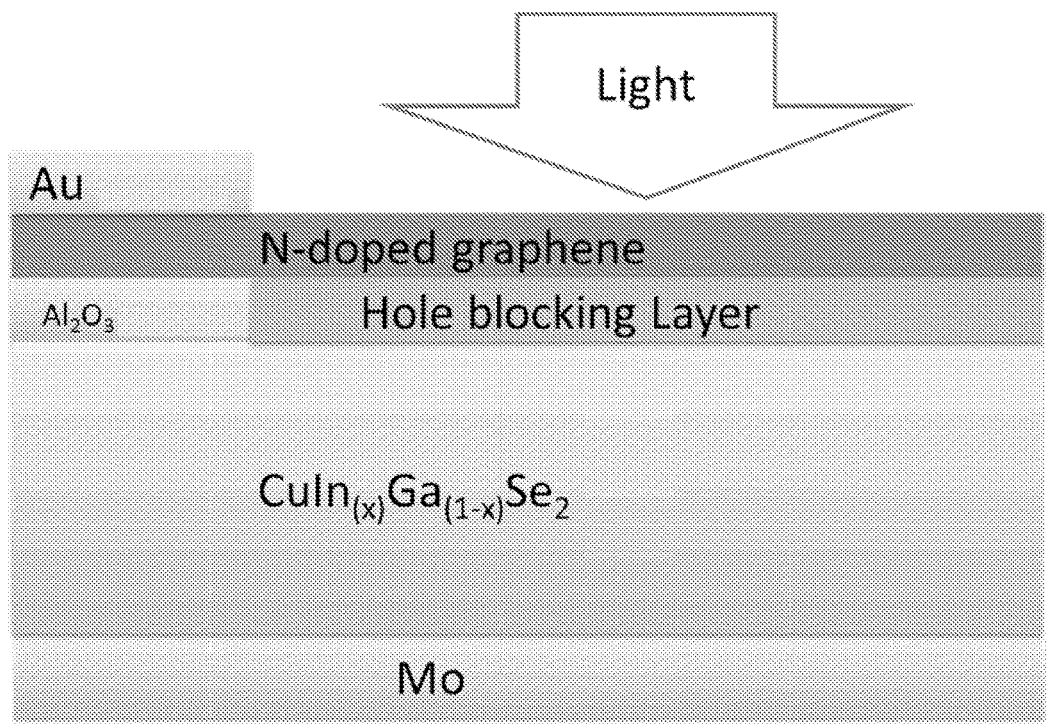
FIG. 2 is a schematic illustration of an exemplary embodiment of the disclosed CIGS based solar cell, with a quasi-2-dimensional electron extracting layer and an organic hole blocking layer.

In one disclosed embodiment illustrated in FIG. 2, the structure of the CIGS solar cell (also referred to as a hybrid CIGS solar cell) contains, but is not limited to, (i) a substrate layer selected from glass, polymer or metal foil (not shown);

(ii) molybdenum (Mo) layer; (iii) a p-type polycrystalline CuIn$_x$Ga$_{1-x}$Se$_2$ (CIGS) absorber layer; (iv) an organic based hole blocking layer, which may contain a phenanthroline compound or a derivative thereof; and (v) an n-doped separation/collection layer having a crystalline structure selected from the quasi 2-dimensional (2D) graphene. As shown in FIG. 2, the CIGS solar cell can further have a top gate transparent Au electrode deposited on an Al$_2$O$_3$ dielectric layer. The width of each layer in this embodiment is not particularly limited and can be adjusted by those skilled in the art to meet the needs of the user.

This embodiment uses the present quasi two dimensional materials, such as graphene and MoS$_2$ to create highly transparent, conductive and tunable electron extraction layers interfaced with CIGS, as shown in FIG. 2. In utilizing graphene, the layer may be synthesized by chemical vapor deposition methods as known in the art and transferred to the CIGS active layers deposited on Mo/Glass substrates. The graphene sheet may be doped n-type to form a built-in electric field when interfaced with p-doped CIGS. Between the graphene and CIGS layer, an ultra-thin film of wide-bandgap organic hole blocking layer (i.e BCP) is deposited to mitigate recombination and passivate the top interface of the CIGS.

Figure 3A:
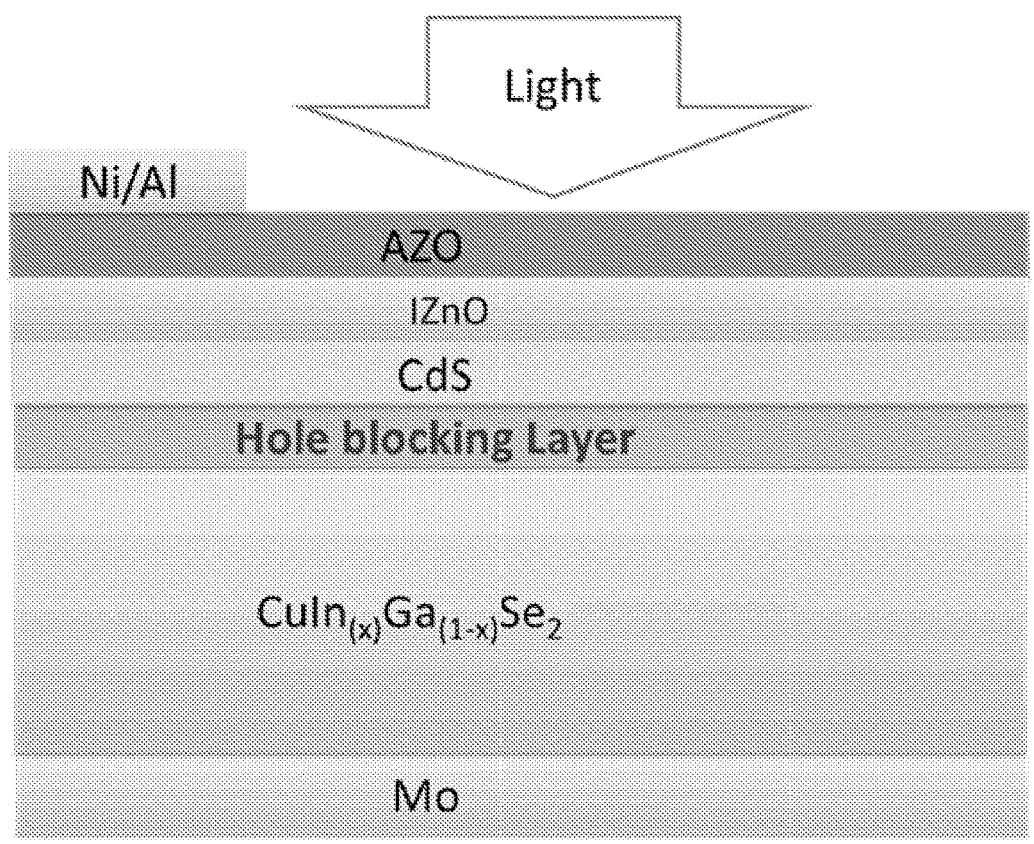
FIG. 3A is a schematic illustration of an exemplary embodiment of the disclosed CIGS based solar cell, with an organic hole blocking layer.

In another disclosed embodiment illustrated in FIG. 3A, the CIGS solar cell is composed of AZO/iZnO/CdS/CIGS/Mo layers and an organic hole blocking layer between the CIGS absorber layer and the AZO/iZnO/CdS layers. The organic based hole blocking layer is as described above. In some embodiments, the organic based hole blocking layer may contain a phenanthroline compound or a derivative of the phenanthroline compound listed in Table 2 or compounds listed in Table 1. For example the derivatives of the phenanthroline compound can be selected from 1,10-phenanthroline, bathophenenthroline (4,7-diphenyl-1,10-phenanthroline), bathocuproine (2,9-Dimethyl-4,7-diphenyl-1,10-phenanthroline) and bathocuproine (BCP). In one embodiment the phenanthroline derivative is BCP.

TABLE 2

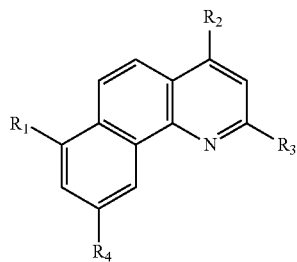

Derivative of the phenanthroline compound.

| R$_1$ | R$_2$ | R$_3$ | R$_4$ | Chemical Name |
|---|---|---|---|---|
| H | H | H | H | 1,10-phenanthroline |
| Phenyl | Phenyl | H | H | bathophenenthroline |
| Phenyl | Phenyl | Methyl | Methyl | bathocuprione |

Figure 3B:
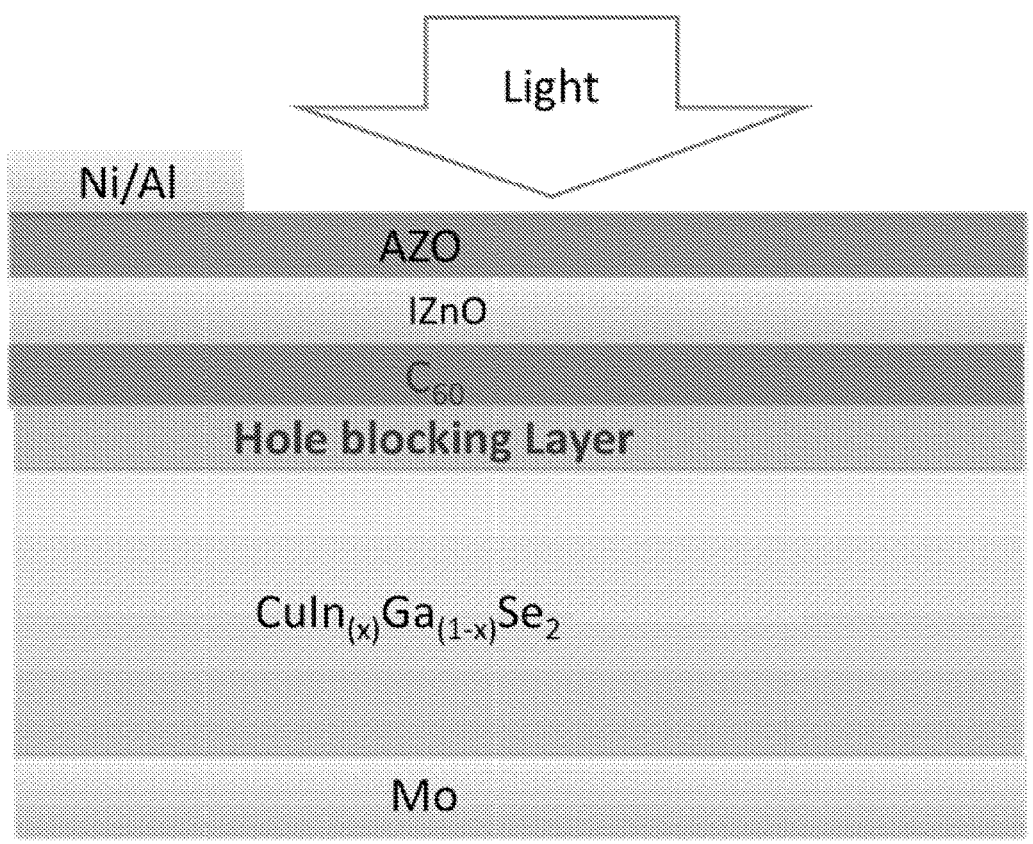
FIG. 3B is a schematic illustration of an exemplary embodiment of the disclosed CIGS based solar cell, with an electron acceptor ($C_{60}$) that reduces interfacial recombination in CIGS structure.

In yet another disclosed embodiment illustrated in FIG. 3B, the CIGS solar cell is an AZO/iZnO/C$_{60}$/CIGS/Mo solar cell having (i) an organic hole blocking layer as discussed above. The electron extraction layer in such embodiment is an electron transporting (n-type) buckminster fullerene C$_{60}$ or a derivative thereof. It is believed that the use of C$_{60}$ fullerene layer instead of the CdS layer in conjunction with a hole-blocking organic layer allows for electron extraction from CIGS and the reduction of interfacial recombination in CIGS structure.

A hole-blocking layer of TiO$_2$ may also be incorporated between the CIGS and graphene contact. The TiO$_2$ layer may be used alone or in combination with the above described organic layer.

The present disclosure includes a method of manufacturing a photovoltaic cell, comprising depositing a back contact layer on a surface of a substrate; depositing a p-type polycrystalline CuIn$_{1-x}$Ga$_x$Se$_2$ (CIGS) absorber layer, where x is between 0.3 and 1 on a surface of the back contact layer; depositing an insulating layer or a passivation layer on a surface of the absorber layer opposite to the back contact layer; and transfer a graphene monolayer onto a surface of the insulating layer or a surface of the passivation layer without damaging the absorber layer. The insulating layer may include an oxide such as Al$_2$O$_3$ and SiO$_2$. The passivation layer may contain a nitride such as Si$_3$N$_4$. Non-limiting examples of the width of the insulating layer or the passivation layer include about 400, 350, 300, 250, 200, 150, 100, and 50 nm. The back contact layer can be deposited on the substrate surface via known procedures such as sputtering. The absorber layer can be deposited by a vacuum-based process, where copper, gallium, and indium are co-evaporated or co-sputtered onto the back contact layer at room temperature.

A method of converting light into electric current is provided, utilizing the CIGS solar cell incorporating one or more embodiments disclosed above.

A method of making an n-doped graphene is also provided comprising contacting a first surface of a p-doped semiconductor material with a alkaline metal-containing substrate, wherein said alkaline metal-containing substrate is optionally coated with a back contact layer; and contacting a second surface of said p-doped semiconductor material with a graphene, wherein said second surface of said p-doped semiconductor material is optionally coated with an insulating layer or a passivation layer. In particular, the doping is strengthened by the concentration of sodium atoms at the surface of a semiconductor that serves as the graphene substrate. In some embodiments, the alkaline metal is sodium and the p-doped semi-conductor material is CuIn$_{1-x}$Ga$_x$Se$_2$, where x is between 0.3 and 1. The substrate can be, for example, a glass, a polymer foil, or a metal foil. For example, a common source of sodium is soda-lime glass. Alternatively, the graphene can be n-doped by contacting directly with the sodium-containing glass. The studies on the process of n-doping graphene are further illustrated in the examples. When the solar cell material copper indium gallium selenide (CIGS) is deposited onto soda-lime glass substrates, graphene transferred onto the CIGS thin film shows even stronger doping than graphene transferred to soda-lime glass alone. Such a strengthening in doping is likely due to the diffusion of sodium throughout the CIGS film, and especially strong concentration of sodium at the top surface (>2×10$^{20}$ at/cm$^3$).

In some embodiments, n-doped graphene can be produced by contacting a alkaline metal-containing substrate with a graphene which is not n-doped prior to the contact. The substrate can be, for example, a glass, a polymer foil, or a metal foil. In some embodiments, the metal is sodium.

The alkaline metal in the substrate can be in the form of a cation or a neutral atom carrying no charge. For example, sodium in a soda lime glass can exist as a cation in the form of Na$_2$O. Meanwhile, sodium in the CIGS may be in the form of Na$_2$CO$_3$.

The n-doping of graphene via surface-transfer doping from alkaline metal atoms is a scalable, low-cost method for achieving strong, controllable, and persistent result. It is useful in a host of applications, including graphene-semiconductor diodes, batteries, fuel cells, sensors, and solar cells. Among its certain electrical properties, the combination of excellent optical transmission (97.5%) with rapid charge transporting properties (~25,000-30,000 cm$^{-2}$ V$^{-1}$ s$^{-1}$ for substrate-bounded graphene and greater than 200,000 cm$^{-2}$V$^{-1}$ s$^{-1}$ for suspended graphene) may be used for development of low-cost and flexible transparent electrical contacts for solar cells and photodetectors. Because graphene can be used directly as part of the p-n junction as described herein, it is now feasible to harness its full potential in photovoltaic device applications by allowing band-offset engineering of the p-n junction through precise doping control of the graphene.

Also provided in this disclosure is an article of manufacture containing the n-doped graphene produced according to the above described methods. The present n-doped graphene of the present invention may also find applications in technologies including for example batteries, sensors, fuel cells, and also as a transparent, highly-conductive, and electrically tunable contact for solar cells.

The examples set forth below also serve to provide further appreciation of the disclosed invention, but are not meant in any way to restrict the scope of the invention.

EXAMPLES

Example 1

Figure 6A:
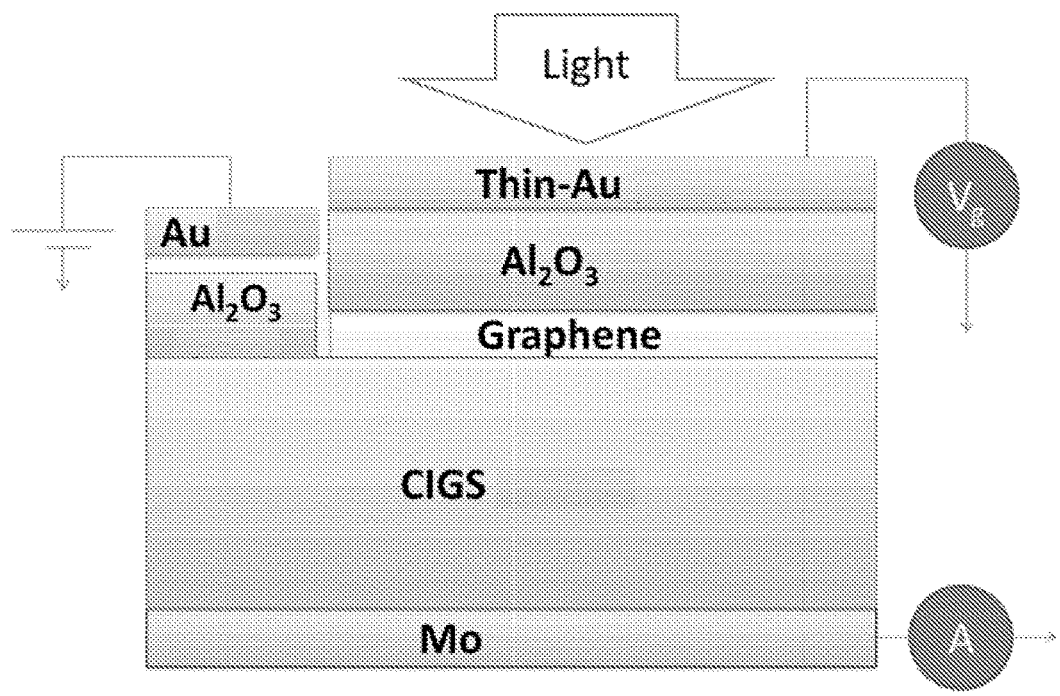
FIG. 6A is a schematic illustration of a prototype of the disclosed Graphene/CIGS/Mo device, having an ultrathin Au top gate electrode.

This example illustrates fabrication of a prototype Graphene/CIGS/Mo solar cell having a layer arrangement shown in FIG. 6A. Specifically, CuIn$_{(1-x)}$Ga$_{(x)}$Se$_2$ (x=0.3) films were obtained from University of Albany, College of Nanoscale Science and Engineering and deposited by 3-stage evaporation method on a Mo (330 nm)/Glass (3 mm) substrate. A single-layer graphene grown by chemical vapor deposition was obtained on Cu foil by CVD graphene growth on a Graphene Supermarket Synthesizer (Single Layer Graphene on Copper foil: 2"×2", (#CVD-Cu-2X2)). The graphene was transferred by etching the Cu onto the CIGS films (layers). A top gate transparent Au electrode was deposited onto the Al$_2$O$_3$ dielectric layer.

A conventional CIGS device with AZO/iZNO/CdS deposited on the same CIGS active layer was also prepared as a reference (not shown). It was determined that under AM1.5G the reference conventional-CIGS cells performed with 14% efficiency.

Example 2

Figure 5:
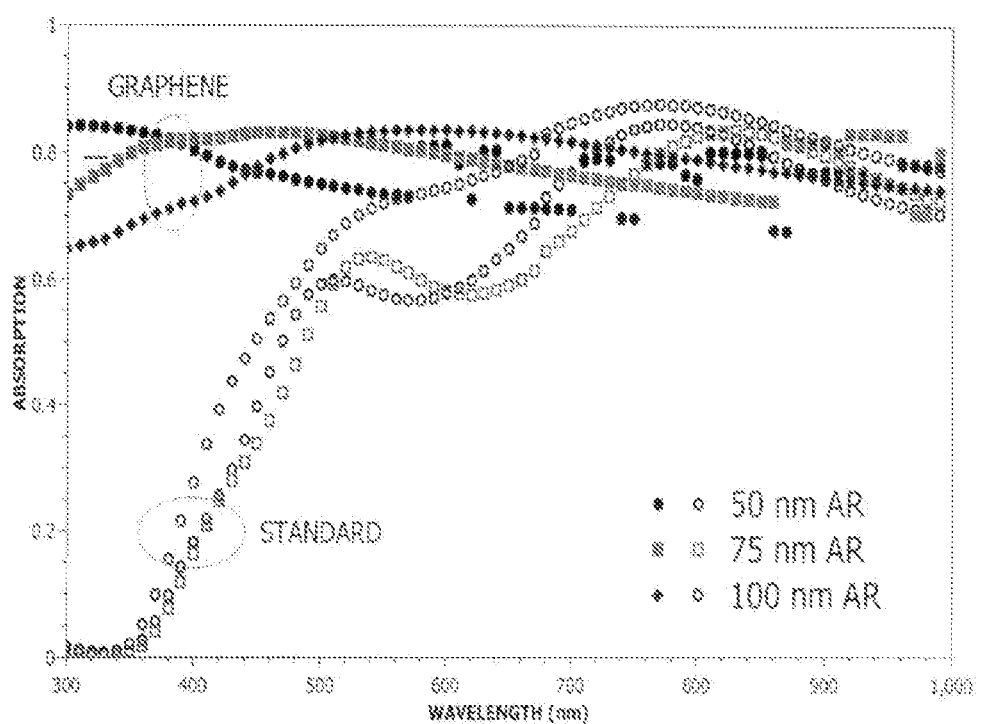
FIG. 5 is a plot illustrating the optical absorption fraction within the CIGS layer in a AZO/iZnO/CdS/CIGS/Mo layout of the prior art device and the Graphene/CIGS/Mo layout, with several different thicknesses of $MgF_2$ anti-reflection (AR) coatings.

This example illustrates the performance and the optoelectrical characteristics of the devices having a single-layer graphene prepared as described in Example 1. In order to spatially localize the photocurrent generation, the cell was measured under laser beam induced current by rastering the top side of the cell at different wavelengths. FIG. 5 shows a substantial improvement in the optical absorption within the CIGS layer of the Graphene/CIGS/Mo solar cells (photovoltaics) at wavelength below 750 nm. Significantly higher optical absorption was observed in the active layer of the CIGS/Graphene sample at wavelengths between 300-700 nm.

Example 3

To reduce reflection from CIGS cells a uniform anti-reflection (AR) coating was used for both conventional (AZO/iZnO/CdS/CIGS/Mo) CIGS and the graphene hybrid CIGS cell. When integrated with AM1.5G as illustrated in FIG. 5, the effective improvement of short circuit current, as well as the optimum AR thickness was determined for the hybrid CIGS cell. The results were compiled and shown in Table 3. These results show that the optimal enhancement of the absorption (i.e., highest absorption improvement) and the highest short circuit current (J$_{sc}$~4.6 mA/cm$^2$) for the hybrid CIGS cell under AM1.5 solar illumination conditions (AM1.5G) is about 75 nm.

TABLE 3

Enhancement of the absorption and J$_{sc}$ for the graphene/CIGS/Mo PV under AM1.5G

| AR thickness (nm) | Absorption Improvement | AM1.5G J$_{sc}$ improvement (mA/cm$^2$) |
|---|---|---|
| 50 | 0.15 | 3.3 |
| 75 | 0.21 | 4.6 |
| 100 | 0.06 | 1.6 |

Example 4

Capacitance-Voltage profiling and Admittance Spectroscopy was measured by an A/C impedance measurement set up including a Rigol function generator (10-100 KHz, 2 mVRMS) with input signal (Rigol, DG1022) and a Stanford Research dual channel locking amplifier (Stanford Research, SR830). Using this setup the junction capacitance was calculated. The average charge density and charge density profile in the depletion region was calculated via Mott-Schottky analysis. CV-profiling was carried out at each gate bias thereby measuring the electrostatic gate dependent formation of the space-charge region between graphene and CIGS.

Figure 6B:
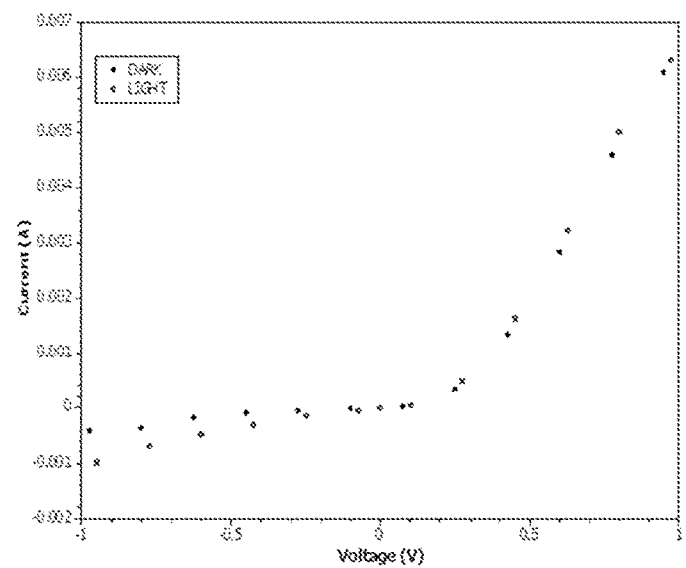
FIG. 6B is a plot showing the light and dark current behavior of the device illustrated in FIG. 6A.

Ideally photovoltaic devices behave like diodes, with dark current/voltage (J/V) curves following the Shockley equation. Little or no measurable current flows in the dark, reverse bias direction, whereas in the forward bias direction, current increases exponentially with applied voltage. When the OPV (diode) is illuminated, the J/V curve is ideally shifted down at all potentials by the magnitude of J$_{sc}$, the short-circuit photocurrent. It is in the third quadrant of the J/V curve where power is generated in an external load. FIG. 6B illustrates the current-voltage relationship of the hybrid CIGS cell under illumination. The figure shows that under illumination there was increase of current in the reverse bias (voltage<0). This illustrates that the graphene/CIGS device a) showed diode behavior with electrons and holes being swept in the opposite directions and b) had the capability to generate photocurrent under illumination.

Example 5

Figure 7:
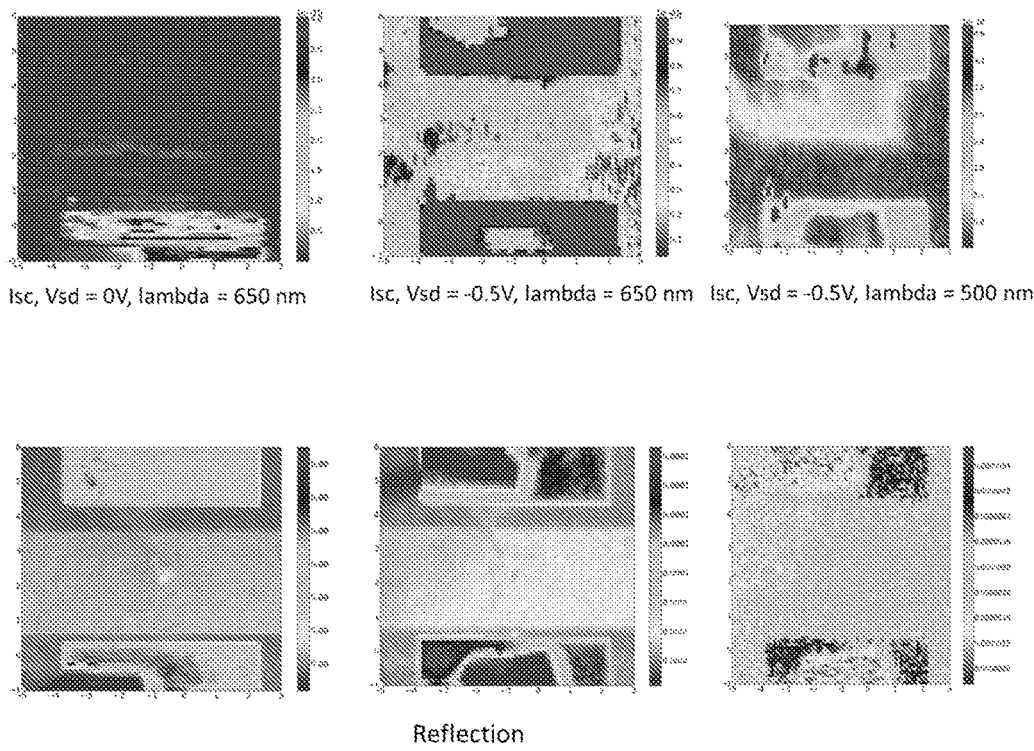
FIG. 7 illustrates the photocurrent obtained from the Graphene/CIGS/Mo device and the resulting reflection from the sample.

In order to spatially localize the photocurrent generation, the cell's output was measured under laser beam induced current, by rastering the top side of the cell at different wavelengths. FIG. 7 are photomicrographs illustrating the optoelectrical characteristics for the disclosed Graphene/CIGS/Mo device. The top images illustrate the photocurrent obtained from the sample. The bottom images illustrate the resulting reflection from the sample. Specifically, FIG. 7 shows the LBIC measurement indicating the photocurrent from the graphene/CIGS/Mo device and the reflection of the incident light on the sample with a gate contact. Even with the intrinsic graphene, there is some photocurrent from the Graphene/CIGS/Mo interface, indicating that charge separation and collection occurs within the graphene/CIGS interface. As shown in the images, the photocurrent from the device at 650 nm illumination is seen to increase when the direction of the bias is in reverse. Furthermore, there is a significant difference in photocurrent when the wavelength is changed from 650 nm to 500 nm. The resulting photocurrent intensity difference is due to the absorption difference in the CIGS active layer at different wavelengths. The bottom images show reflection from the device which is simultaneously used to image the device when the photocurrent is collection. Furthermore, the reflection signal can be used to account light absorbed within the cell for a given wavelength thereby providing a means to calculate the internal quantum efficiency of the device.

Example 6

Figure 8:
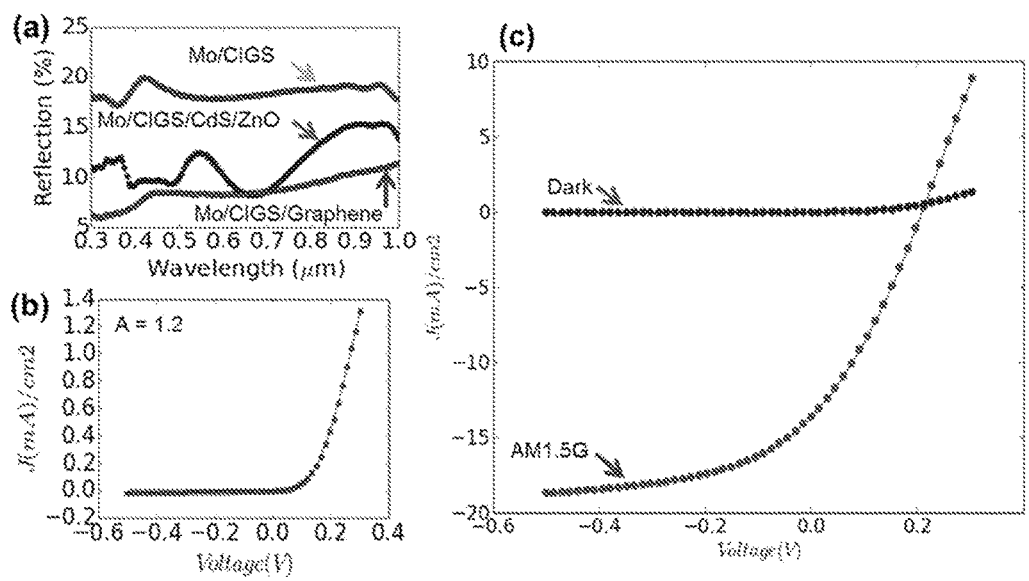
FIG. 8($a$) illustrates the reflection of a pristine Mo/CIGS (green-line), a conventional CIGS (Mo/CIGS/CdS/ZnO) PV substrate (blue-line) and a Mo/CIGS/Gr (red) substrate.

This example illustrates the reflection of a pristine Mo/CIGS (shown in green-line), a conventional CIGS (Mo/CIGS/CdS/ZnO) PV substrate (shown in blue-line) and a Mo/CIGS/Gr (shown in red-line) substrate (FIG. 8(a)). It was seen that the Graphene based sample had the lowest reflection of all and therefore resulted in the highest absorption in the cell. FIG. 8(b) shows the I-V device characteristics in the dark in the Graphene/CIGS device. The ideality factor (A) of the dark curve was calculated as 1.21 by directly fitting the Shockley equation to the data. FIG. 8(c) shows the I-V device characteristics between the top-Au and bottom-Mo contact of a 100 µm² device area graphene/CIGS PV device. The measurements were taken with the $V_{Gtop}$ floating under dark and AM1.5G illumination, corresponding to $2 \times 10^{13}$ cm$^{-2}$ electron-doping of the graphene layer. An exponential I-V behavior was obtained which indicates the formation of a built-in field in the graphene/CIGS interface. Under AM1.5G a short-circuit current ($J_{sc}$) of 13.6 mA/cm² was obtained producing a power conversion efficiency is 0.87%. The conversion efficiency in this device was limited by the open circuit voltage (Voc) 0.21V.

Example 7

Figure 9:
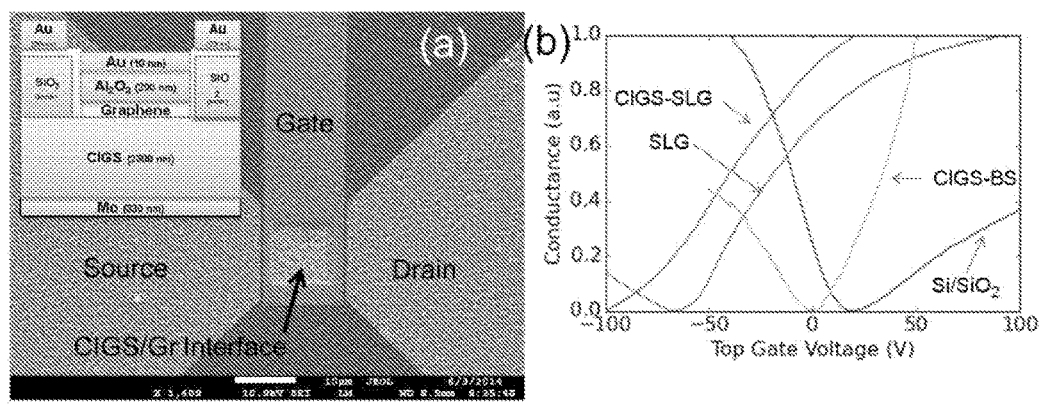
FIG. 9($a$) shows the GR/CIGS four-terminal device fabricated to measure the optoelectronic properties at the interface.

This example illustrates the optoelectronic properties of different interfaces. SEM in FIG. 9(a) shows the GR/CIGS four-terminal device fabricated to measure the optoelectronic properties at the interface. FIG. 9(b) shows the comparison of the transconductance measured on the following substrates: CIGS/Mo/SLG (shown in red curve), CIGS/Mo/BSG (shown in yellow curve), SLG (shown in green curve), Si/SiO2 (shown in blue curve). For the cases of CIGS/Mo/SLG, CIGS/Mo/BSG, and SLG, the transconductance was obtained by changing the potential applied to the top gate ($V_{Gtop}$) whereas in the case of Si/SiO2/GR device a back-gate was used. The $V_{sd}$ was kept at 10 mV and the measurements were carried out in the dark. As $V_{Gtop}$ is varied from 20 V to –100 V, the source-drain conductance of graphene asymptotically decreases towards a minimum in conductance (Dirac point). For the cases of CIGS/Mo/SLG, and SLG, a large negative bias must be applied to make the graphene charge neutral, demonstrating that for these substrates the graphene has become intrinsically n-doped during the fabrication process. In contrast, transconductance measurements indicate that on CIGS/Mo/BS and Si/SiO2 as substrates, the graphene is neutral (CIGS/Mo/BS) and slightly p-doped (Si/SiO2). These results point to the surface-transfer doping of graphene by sodium atoms that originate in the SLG, and in the case of CIGS/Mo/SLG substrates, diffuse throughout the CIGS. The role of Na in the performance of CIGS solar cells is well documented, and here it is observed that Na has an additional effect on graphene-CIGS interfaces as it serves to strongly n-dope the graphene, which is useful for efficient graphene-CIGS photovoltaic devices.

Example 8

In this example, prototype graphene/CIGS devices were fabricated and characterized. CuIn$_{0.7}$Ga$_{0.3}$Se2 was deposited by three-stage co-evaporation on Mo coated (330 nm) soda-lime glass substrates (3 mm thick). When these same CIGS layers are incorporated into conventional (Mo/CIGS/CdS/iZnO/AZO) devices, the current-voltage curves yield a power conversion efficiency in the range of 15-18%.

In order to make graphene/CIGS devices, 450 nm of SiO$_2$ was first deposited on top of the CIGS-coated Mo substrates via plasma-enhanced chemical vapor deposition (PECVD) at 400 C.° at 1.6 nm/s rate. Next, 1×1 µm to 100×100 µm regions were patterned on the PECVD SiO$_2$ using electron beam lithography JEOL JBX-6300FS system (exposed on ZEP520A positive resist spun at 2000 rpm for 40 sec annealed at 180 C.° for 3 minutes with a dose of 400 µC/cm² at 100 keV and developed with hexylacetate for 90 sec). These patterned regions were then etched via Reactive Ion Etching (RIE) (Oxford Plasmalab 100 ICP etcher) using a mixture of (CHF$_3$ and Ar gas) at 15 nm/min, until the CIGS was exposed. Commercially obtained CVD single-layer graphene on Cu foil (Graphene Platform) was then transferred from the Cu substrates to the SiO$_2$/CIGS/Mo glass substrates. The graphene transfer was done by coating the graphene side of the graphene/Cu foils with PMMA (1 weight percent dissolved in chlorobenzene spun at 2000 rpm for 30 sec and annealed at 140 C per 1 min), oxygen plasma etching (March Plasma Etcher, 100 W, 100 mT for 20 sec) the opposite side, and etching the Cu using ammonium persulphate (0.1 M) solution. As the Cu was etched away the graphene/PMMA film floated on the etchant and it was washed in de-ionized water (>18 MΩ resistivity using a Millipore DI system) and it then transferred, graphene-side down, onto the SiO$_2$/CIGS/Mo substrates. The graphene transfer process onto the patterned SiO$_2$/CIGS/Mo substrates resulted in patches of graphene covering the surface, with some regions of single-layer and some regions of bi-layer graphene (see Supplemental Information for more details). Those regions of exposed CIGS that were entirely covered with a single-layer graphene patch were the regions which were subsequently developed into the complete devices. The substrates were annealed at 100 C for 30 minutes in a vacuum oven and were subsequently annealed at 200 C for 30 minutes to soften the PMMA and promote adhesion onto the SiO$_2$/CIGS/Mo substrate.

Next, the PMMA was removed from the graphene using acetone and the device was further annealed in a Rapid Thermal Annealer (375 C under Ar and H$_2$ (4%) gas for 10 minutes). Afterwards the graphene deposited on the substrate was etched to cover the specific etched regions via oxygen plasma (March plasma, 100 W and 100 mT for 1 minutes) using a negative tone resist mask (ma-N 2403, spun at 2000 rpm for 30 sec exposed at 200 µC/cm² dose for 100 keV electron beam and developed using ma-D 532 negative tone developer for 1 min). Afterwards source-drain electrical contacts (Au (30 nm)/Cr (5 nm)) were deposited on the graphene by patterning with electron beam lithography (JEOL JBX-6300FS system exposed on ZEP520A 1:1 diluted in anisole positive resist spun at 4000 rpm for 40 sec annealed at 180 C.° for 3 minutes with a dose of 400 µC/cm² at 100 keV and developed with hexylacetate for 90 sec) and deposited using an electron beam evaporator (Kurt J. Lesker PVD 75 thermal/e-beam evaporator).

Afterwards a 200 nm gate-dielectric layer ($Al_2O_3$) was blanket deposited on the Au/Cr/Gr/$SiO_2$/CIGS/Mo substrate via Atomic Layer Deposition at 1 Å/cycle using TMA/Water precursor at 250 C. On top of the $Al_2O_3$, a semi-transparent top-gate (10 nm of Au) was deposited via ebeam patterning (JEOL JBX-6300FS system exposed on ZEP520A 1:1 diluted in anisole positive resist spun at 4000 rpm for 40 sec annealed at 180° C. for 3 minutes with a dose of 400 µC/cm² at 100 keV and developed with hexylacetate for 90 sec) and an ebeam evaporator. The source and drain electrodes were exposed through the dielectric layer by exposing and patterning etch holes using ebeam-lithography using the same recipe as described above. The $Al_2O_3$ was etched using Oxford Plasmalab 100 ICP etcher (2 nm/sec) to expose the buried Au contact for electrical measurements.

The optoelectronic properties of the devices were characterized under AM1.5G and dark conditions. Using the top-gate, the Fermi level of the graphene was tuned via electrostatic doping, and the effect on the device performance was investigated. Furthermore, the specific electrical properties of the Graphene/CIGS interface was studied via temperature dependent current-voltage, Capacitance-Voltage profiling/admittance spectroscopy in order to characterize the physics of photovoltaic junction formation, depletion-layer width (via junction capacitance), charge density profile (Mott-Schottky analysis). C-V profiling/admittance spectroscopy measurements were obtained by an LCR meter setup.

Example 9

Figure 10:
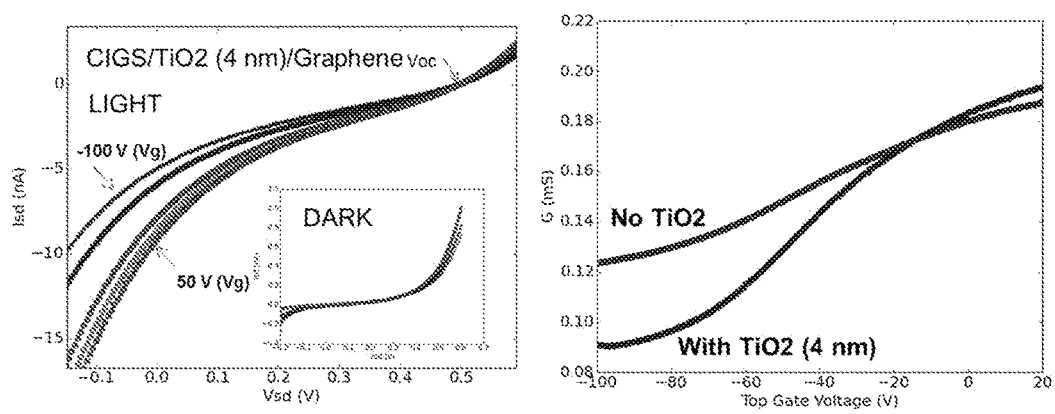
FIG. 10 illustrates the Current-Voltage characteristics of $CIGS/TiO_2$/Graphene device under illumination with different gate biases.

This example illustrates the Current-Voltage characteristics of a CIGS/$TiO_2$(2 nm)/Graphene device under illumination with different gate biases (FIG. 10). Because a pure graphene/CIGS device can show significant interfacial recombination which reduces the Voc of the device, a hole-blocking layer was deposited between the CIGS and graphene contact. For this a 10 nm layer of ALD deposited TiO2 was deposited prior to the transfer of the graphene layer.

It will be appreciated by persons skilled in the art that the present invention is not limited to what has been particularly shown and described. Rather, the scope of the present invention is defined by the claims which follow. It should further be understood that the above description is only representative of illustrative examples of embodiments. The description has not attempted to exhaustively enumerate all possible variations. The alternate embodiments may not have been presented for a specific portion of the invention, and may result from a different combination of described portions, or that other un-described alternate embodiments may be available for a portion, is not to be considered a disclaimer of those alternate embodiments. It will be appreciated that many of those un-described embodiments are within the literal scope of the following claims, and others are equivalent. Furthermore, all references, publications, U.S. Patents, and U.S. Patent Application Publications cited throughout this specification are incorporated by reference as if fully set forth in this specification.

The invention claimed is:

1. A photovoltaic device, comprising:
   a substrate,
   a back contact layer,
   an absorber layer comprising p-doped polycrystalline CuIn1-xGaxSe2, where x is between 0.3 and 1, and
   an n-doped charge-separation and/or collection layer, wherein said charge-separation and/or collection layer is n-doped graphene, wherein the n-doped graphene is doped with sodium.

2. The photovoltaic device of claim 1, wherein the graphene is n-doped via surface transfer doping which comprises diffusing the sodium from the substrate to a surface of the absorber layer nearest to the graphene.

3. The photovoltaic device of claim 1, wherein the substrate is selected from a glass, a polymer foil, or a metal foil.

4. The photovoltaic device of claim 1, further comprising an organic based hole blocking layer positioned between the absorber layer and the charge-separation and/or collection layer.

5. The photovoltaic device of claim 4, wherein the organic based hole blocking layer comprises a phenanthroline compound selected from Formula 1 and Formula 2:

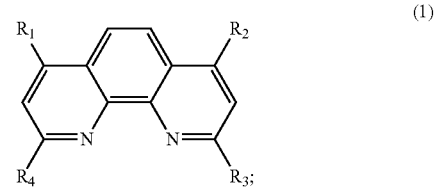

(1)

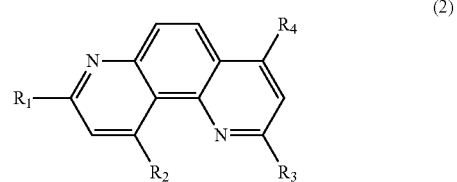

(2)

wherein $R_1$-$R_4$ are independently selected from H, Alkyl, or Phenyl.

6. The photovoltaic device of claim 5, wherein the phenanthroline compound is selected from the group consisting of 2,8-diphenyl-1,7-phenanthroline, 2,8-dimethyl-1,7-phenanthroline, and 2,4-dimethylbenzo[j][1,7] phenanthroline.

7. The photovoltaic device of claim 1, further comprising a $TiO_2$ blocking layer between the absorber layer and the charge-separation and/or collection layer.

8. The photovoltaic device of claim 2, wherein the graphene is not n-doped prior to the surface transfer doping, further wherein the substrate contains sodium in an amount effective to render the graphene n-doped.

9. The photovoltaic device of claim 3, wherein the glass is soda lime glass.

* * * * *